(12) United States Patent
Nemoto et al.

(10) Patent No.: US 8,629,730 B2
(45) Date of Patent: Jan. 14, 2014

(54) OSCILLATOR

(75) Inventors: Kenji Nemoto, Tokyo (JP); Tamami Furuya, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 53 days.

(21) Appl. No.: 13/379,679

(22) PCT Filed: Dec. 21, 2010

(86) PCT No.: PCT/JP2010/007401
§ 371 (c)(1),
(2), (4) Date: Dec. 21, 2011

(87) PCT Pub. No.: WO2011/077705
PCT Pub. Date: Jun. 30, 2011

(65) Prior Publication Data
US 2012/0092080 A1  Apr. 19, 2012

(30) Foreign Application Priority Data

Dec. 22, 2009  (JP) ................. 2009-290481

(51) Int. Cl.
*H03B 5/32* (2006.01)
*H03L 1/02* (2006.01)
*H03L 5/00* (2006.01)

(52) U.S. Cl.
USPC ............ 331/158; 331/15; 331/160; 331/176; 331/183

(58) Field of Classification Search
USPC .............. 310/311, 315; 331/15, 34, 116 FE, 331/116 M, 116 R, 154, 158, 160, 176, 182, 331/183
See application file for complete search history.

(56) References Cited

U.S. PATENT DOCUMENTS 5,705,957 A * 1/1998 Oka et al. .................. 331/66
5,977,839 A 11/1999 Tsumura
6,052,036 A * 4/2000 Enstrom et al. ............ 331/176
(Continued)

FOREIGN PATENT DOCUMENTS

CN    1725628 A    1/2006
JP    52-045856    4/1977
(Continued)

OTHER PUBLICATIONS

PCT/IB/338 dated Jul. 12, 2012 for corresponding application PCT/JP2010/007401.
(Continued)

*Primary Examiner* — Levi Gannon
(74) *Attorney, Agent, or Firm* — Morgan, Lewis & Bockius LLP

(57) ABSTRACT

Provided is a temperature compensated oscillator includes an oscillation circuit for oscillating an oscillator. In the oscillator, when an oscillation frequency is changed by a second control signal after being controlled by a first control signal, variation in the oscillation frequency due to a second control signal is set to a fixed amount. The oscillation frequency of the oscillator is controlled on the basis of both the first control signal and the second control signal, but an oscillation amplitude adjusting section is also added, the oscillation amplitude adjusting section allowing the oscillation amplitude of the oscillator to be changed by the second control signal. The oscillator thus allows a fixed amount of oscillation frequency control over a wide range (full range) of oscillation frequency control due to the first control signal.

3 Claims, 13 Drawing Sheets

(56) References Cited

U.S. PATENT DOCUMENTS

| | | | |
|---|---|---|---|
| 6,559,730 B1 * | 5/2003 | Marvin et al. | 331/158 |
| 6,667,664 B2 * | 12/2003 | Akagawa et al. | 331/68 |
| 6,731,181 B2 | 5/2004 | Fukayama et al. | |
| 6,737,928 B2 * | 5/2004 | Kubo et al. | 331/158 |
| 7,154,351 B2 | 12/2006 | Kawasaki et al. | |
| 8,188,802 B2 * | 5/2012 | Garcia | 331/185 |
| 2005/0083141 A1 | 4/2005 | Dahlin | |
| 2006/0017517 A1 * | 1/2006 | Ootsuka et al. | 331/158 |
| 2008/0001678 A1 | 1/2008 | Otsuka | |
| 2011/0037526 A1 | 2/2011 | Sato et al. | |

FOREIGN PATENT DOCUMENTS

| | | |
|---|---|---|
| JP | 63-314011 | 12/1988 |
| JP | 03-283704 | 12/1991 |
| JP | 03-283905 | 12/1991 |
| JP | 04-025210 | 1/1992 |
| JP | 04-176206 | 6/1992 |
| JP | 10-163751 | 6/1998 |
| JP | 2002-290151 | 10/2002 |
| JP | 2003-069343 | 3/2003 |
| JP | 2004-128594 | 4/2004 |
| JP | 2005-529534 | 9/2005 |
| JP | 2006-135739 | 5/2006 |
| JP | 2007-318397 | 12/2007 |
| JP | 4070139 | 4/2008 |
| WO | 2005/006539 | 1/2005 |
| WO | 2009/113657 | 9/2009 |

OTHER PUBLICATIONS

PCT/IB/373 dated Jul. 4, 2012 for corresponding application PCT/JP2010/007401.

Japanese Office Action dated Aug. 7, 2012 for corresponding patent application No. 2011-547300.

SIPO: Office Action for Chinese Patent Application No. 2010-80013921.1—Issued on Oct. 10, 2013.

* cited by examiner

FIG. 2
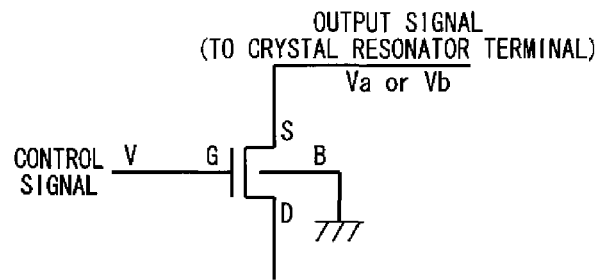
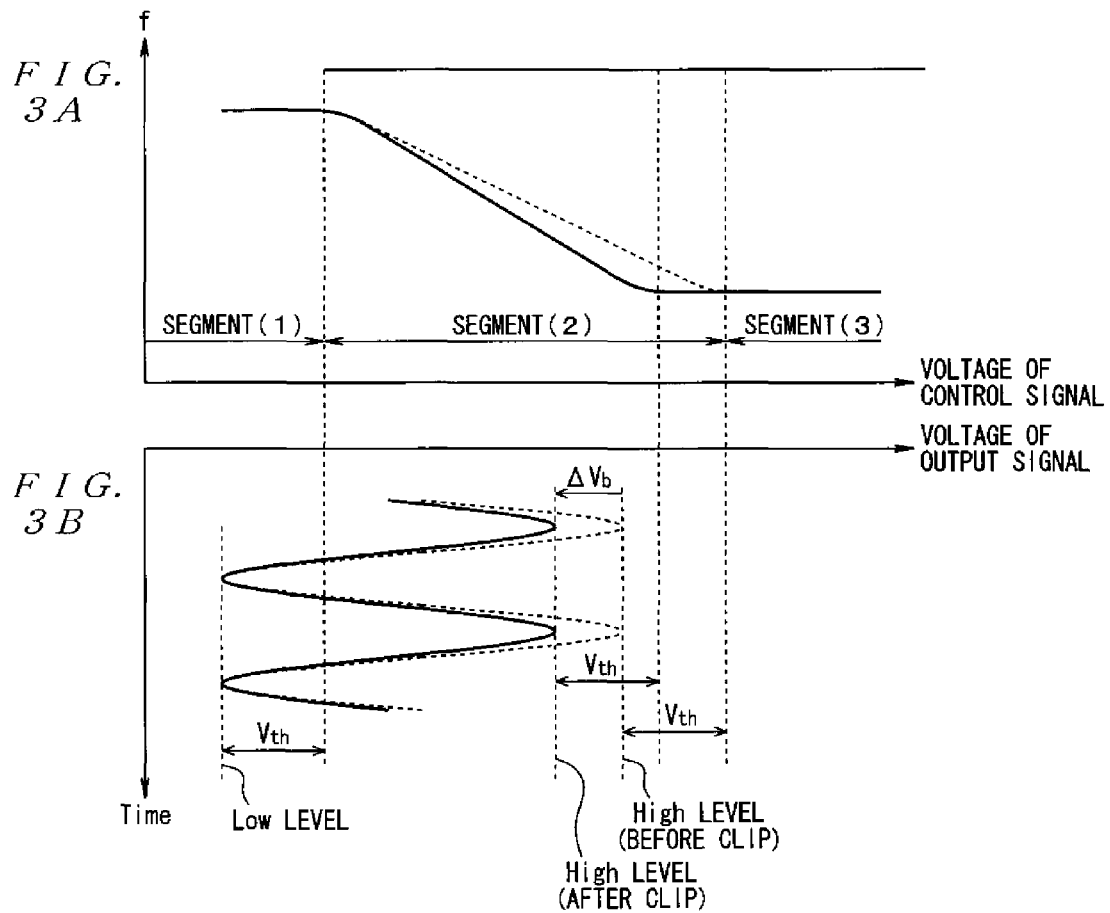
FIG. 3A
FIG. 3B

*F I G. 15*
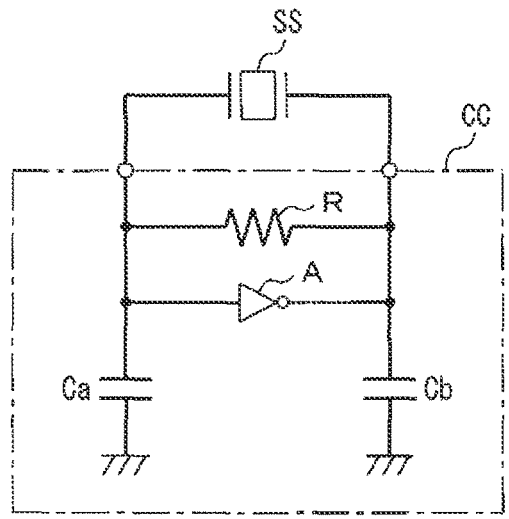
PRIOR ART

PRIOR ART

OSCILLATOR

The present application is the national stage application of PCT/JP2010/007401, filed Dec. 21, 2010, which claims priority to Japanese Patent Application No. 2009-290481, filed Dec. 22, 2009, the contents of which are incorporated herein by reference.

TECHNICAL FIELD

The present invention relates to an oscillator, in particular, to an oscillator including an oscillation circuit to oscillate a resonator.

BACKGROUND ART

In recent years, there is an increasing demand for the advent of an oscillator with high precision frequency stability (e.g. within ±0.28 ppm in the Stratum 3) in a base station for a mobile phone or in a transmission system which needs to meet the Stratum 3 specifications.

A temperature compensated crystal oscillator is utilized in these applications as a reference clock source, and has a trait of reducing frequency changes of a crystal resonator to temperature. This is achieved by controlling temperature characteristics (e.g. its temperature characteristics are approximated using a cubic function in a crystal resonator made of crystal unit quarried out at a cutting angle, which is called AT cut) of a crystal resonator (piezoelectric resonator).

FIG. 15 is a view showing a configuration of a general crystal oscillator.

In FIG. 15, the crystal oscillator includes a crystal resonator SS and an oscillation circuit CC to oscillate the crystal resonator SS. The oscillation circuit CC includes an amplifier A and a resistor R connected in parallel to the crystal resonator SS, a load capacitance element Ca (capacitance value $C_{ca}$) connected between an input side of the amplifier A and ground, and a load capacitance element Cb (capacitance value $C_{cb}$) connected between an output side of the amplifier A and the ground.

The above resistor R is also referred to as feedback resistor, which functions as defining a DC operating point of input and output.

In the aforesaid configuration, if the load capacitance elements Ca and Cb each have a variable capacitance, it will be able to control an oscillation frequency.

FIG. 16 is a view showing an equivalent circuit of the crystal oscillator shown in FIG. 15.

In FIG. 16, a crystal resonator side SSS has a configuration in which a motional capacitance C1 (capacitance value $C_{C1}$), a resonance resistance R1 (resistance value $R_{R1}$), a motional inductance L1 (reactance value $L_{L1}$), and a shunt capacitance C0 (capacitance value $C_{c0}$).

In the meantime, the oscillation circuit side CCS has a configuration in which a resistance component Rn (resistance value $R_{Rn}$) and a capacitance component CL (capacitance value $C_{CL}$) are connected in series. The resistance component Rn is a negative resistance component having a negative value. A well-known LC oscillator may be configured by cancelling a resistance value of the resistance component R1 with a resistance value of the negative resistance component.

Specifically, the capacitance component CL is an oscillator equivalent capacitance component of an equivalent circuit. A relationship among the capacitance value $C_{CL}$ of the oscillator equivalent capacitance component CL, the capacitance value $C_{Ca}$ of the load capacitance element Ca, and the capacitance value $C_{Cb}$ of the load capacitance element Cb is expressed by an equation (1) below:

$$C_{CL}=(C_{Ca} \times C_{Cb})/(C_{Ca}+C_{Cb}) \quad (1)$$

The equation (1) indicates that when the capacitance value $C_{Ca}$ of the load capacitance element Ca is small and the capacitance value $C_{Cb}$ of the load capacitance element Cb is small, the capacitance value $C_{CL}$ of the oscillator equivalent capacitance component CL becomes small.

Here, a relationship between the capacitance value $C_{CL}$ of the oscillator equivalent capacitance component CL and an oscillation frequency f is expressed by an equation (2) below:

$$F=\tfrac{1}{2}\pi\{L_{L1} \times C_{C1} \times (C_{C0}+C_{CL})/(C_{C0}+C_{C1}+C_{CL})\}^{1/2} \quad (2)$$

The oscillation frequency f describes a curve as shown in FIG. 17 to the value $C_{CL}$ of the oscillator equivalent capacitance component CL.

Referring to FIG. 17, it shows that the oscillation frequency f drops in substantially inverse proportion to an increase in the capacitance value $C_{CL}$ of the oscillator equivalent capacitance component CL.

Herein, prior art of a voltage controlled oscillator to supply a voltage as a control signal is shown in FIG. 18.

In FIG. 18, it is feasible to raise (or drop) a voltage of a control signal CS to increase (or decrease) the capacitance value $C_{CL}$ of the oscillator equivalent capacitance component, thereby dropping (or raising) the oscillation frequency f (e.g. see Patent Document 1).

In addition, in FIG. 18, if a control signal is input as the control signal CS so as to correct temperature characteristics of an oscillation frequency of the crystal resonator, it will become possible to configure a temperature compensated oscillator.

The temperature characteristics of the oscillation frequency of the crystal resonator made of AT cut crystal are approximated using a cubic function for temperature.

The capacitance value $C_{cL}$ of the oscillator equivalent capacitance component in the above-mentioned equation (2) is so controlled by the control signal CS of the temperature compensated oscillator as to correct the temperature characteristics of the oscillation frequency of the crystal resonator. This enables reducing a change in the oscillation frequency f to temperature.

Here, where an oscillator with high precision below 0.5 ppm is required, in the conventional technique the temperature characteristics of the oscillation frequency of the crystal resonator have been corrected up to a high-order component higher than a third-order component. This enables improving the accuracy more than a case where approximation is made using a cubic function (see e.g. Patent Document 2).

In FIG. 19, here is an example of the temperature characteristics of the oscillation frequency of the crystal resonator made of AT cut crystal unit and an example of the temperature characteristics of the oscillation frequency after temperature compensation in a case where the temperature characteristics are the temperature compensated by the temperature compensated oscillator.

In FIG. 19, concerning the oscillation frequency of the crystal resonator made of the AT cut crystal unit, an oscillation frequency fa at temperature Ta is higher than an oscillation frequency f0 at temperature T0 by Δfa. Because of this, the temperature compensated oscillator shown in FIG. 17 makes its oscillation frequency closer to the oscillation frequency f0 by increasing the capacitance value $C_{CL}$ of the oscillator equivalent capacitance component by ΔCLa from $C_{L0}$ to $C_{La}$, and by dropping the oscillation frequency fa at temperature Ta by Δfa.

Meanwhile, the oscillation frequency fb at temperature Tb is lower than the oscillation frequency f0 at temperature T0 by Δfb. Thus, the temperature compensated oscillator shown in FIG. 17 makes its oscillation frequency closer to the oscillation frequency f0 by decreasing the capacitance value $C_{CL}$ of the oscillator equivalent capacitance component by ΔCLb from $C_{CL0}$ to $C_{CLb}$, and by raising the oscillation frequency fb at temperature Tb by Δfb.

In the temperature compensated oscillator, the capacitance value $C_{CL}$ of the oscillator equivalent capacitance component, different from temperature to temperature, is controlled by the control signal to make a change to the temperature in the oscillation frequency f small.

PRIOR ART DOCUMENTS

Patent Documents

Patent Document 1: WO 2005/006539
Patent Document 2: JP Patent Number 4070139 B

SUMMARY OF THE INVENTION

Problem to be Solved

Although in the voltage controlled oscillator shown in FIG. 18, the temperature compensated oscillator is configured, there are some cases where an Auto Frequency Control (AFC) may be performed for the purposes of adjusting an offset frequency and aging after temperature compensation.

When the offset frequency and the aging are to be adjusted after the temperature compensation, a control signal is input, as a first control signal CS10, as shown in FIG. 20, so as to correct the temperature characteristics of the oscillation frequency of the crystal resonator, and further an AFC control signal is input, as a second control signal CS20, to adjust the offset frequency and the aging.

Configuring the oscillator as above enables adjustment of the offset and the aging after the temperature compensation.

Here, when the oscillation frequency f is raised from f0 to f1 by the second control signal CS20 shown in FIG. 20, a variation Δf of the oscillation frequency from temperature to temperature is always kept constant (ΔfL0), as shown in FIG. 21, even if the capacitance value $C_{CL}$ of the oscillator equivalent capacitance component appeared in the equation (2) is changed. As such, it is desirable for the temperature characteristics of the oscillation frequency f not to be changed.

Actually, the oscillator, however, entails drawbacks that the temperature characteristics of the oscillation frequency shows deteriorated temperature compensation accuracy as shown in FIG. 22. As to the reason why this situation is resulted from will be given below.

The oscillator equivalent capacitance component, different from temperature to temperature, is adjusted so as to have the capacitance value $C_{CL}$ by the first control signal CS10 shown in FIG. 20 for cancelling the temperature characteristics of the oscillation frequency f of the crystal resonator.

The capacitance value of the oscillator equivalent capacitance component is then changed by a fixed value ΔCL by the second control signal CS20 shown in FIG. 20.

In this case, as shown in FIG. 17, when the capacitance value $C_{CLa}$ of the oscillator equivalent capacitance component is changed from $C_{CLa}$ by the fixed value ΔCL, the variation of the oscillation frequency is ΔfLa.

Further, when the capacitance value $C_{CLb}$ of the oscillator equivalent capacitance component is changed from $C_{CLb}$ by the fixed value ΔCL, the variation of the oscillation frequency is ΔfL0.

Furthermore, when the capacitance value $C_{CLb}$ of the oscillator equivalent capacitance component is changed from $C_{CLb}$ by the fixed value ΔCL, the variation of the oscillation frequency is ΔfLb.

FIG. 17 shows that the variation Δf of the oscillation frequency tends to that the small variation ΔfLb of the oscillation frequency of the oscillator equivalent capacitance component CL is largely changed more than the variation ΔfLa of the large oscillation frequency of the oscillator equivalent capacitance component CL.

Thus, in the temperature compensated oscillator, when a capacitance value of the oscillator equivalent capacitance component, different from temperature to temperature, is adjusted by the first control signal CS10 to $C_{CL}$, and then the capacitance value of the oscillator equivalent capacitance component is changed by the second control signal CS20 by the fixed value ΔCL only, the variation Δf of the oscillation frequency from temperature to temperature does not come to be constant, resulting in the deteriorated temperature compensation accuracy.

Here, the deterioration of the temperature compensation accuracy due to a change in the second control signal CS20 hardly poses a problem in the temperature compensated oscillator that needs the frequency stability of a few ppm or so, but it becomes a problem in the temperature compensated oscillator that needs the frequency stability equal to or lower than 0.5 ppm.

The present invention is made in view of the aforesaid situations and its objective is to implement an oscillator able to keep variation of an oscillation frequency constant by a second control signal CS20, when the oscillation frequency is controlled by a first control signal CS10, and then the oscillation frequency is changed by a second control signal CS20.

Solution to the Problem

To accomplish the above-indicated objective, technologies as enumerated below will be proposed in this specification.

According to an aspect of the present invention, there is provided an oscillator including an oscillation circuit to oscillate a resonator, comprising:

an adjusting section for adjusting an oscillation frequency of the oscillator based on a control signal; and an oscillation amplitude adjusting section for varying an oscillation amplitude of the resonator.

The oscillator includes the oscillation circuit to oscillate the resonator, and the adjusting section controls the oscillation frequency of the oscillator based on the control signal.

In the above oscillator, the oscillation amplitude adjusting section varies the oscillation amplitude of the resonator based on the control signal.

The oscillator of the above oscillator may cause the oscillation amplitude of the resonator to be varied by the oscillator amplitude adjusting section based on the control signal.

In the above oscillator, the adjusting section may include: a first adjusting section for adjusting the oscillation frequency based on a first control signal, and a second adjusting section for adjusting the oscillation frequency based on a second control signal.

In the above oscillator, the first adjusting section controls the oscillation frequency based on the first control signal, and the second adjusting section controls the oscillation frequency based on the second control signal.

In the above oscillator, the first adjusting section may be an adjusting section for temperature compensation to keep the oscillation frequency constant regardless of a temperature, and the second adjusting section is an adjusting section for AFC in which any frequency is selectable as the oscillation frequency.

In the above oscillator, the first adjusting section is the adjusting section for temperature compensation and keeps the oscillation frequency constant regardless of temperature. Further, the second adjusting section is the adjusting section for AFC and is selectable any frequency as the oscillation frequency.

In the above oscillator, the oscillation amplitude adjusting section may be an oscillation amplitude limiter unit to vary an oscillation amplitude.

In the above oscillator, the oscillation amplitude adjusting section is the oscillation amplitude limiter unit which causes the oscillation frequency to be varied.

In the above oscillator, the oscillation amplitude adjusting section may be an oscillation stage current regulating section to regulate a current at an oscillator stage.

In the above oscillator, the oscillation amplitude adjusting section may be an oscillation stage current regulating section to regulate a current at a stage of the oscillator.

Advantageous Effect of the Invention

According to the present invention, when the oscillation frequency is controlled by the first control signal, and then the oscillation frequency is further controlled by the second control signal, an oscillator capable of keeping a variation of the oscillation frequency constant by the second control signal is achieved.

BRIEF DESCRIPTION OF THE DRAWINGS

FIG. 2 is a view showing a configuration example of a variable capacitance element that is a component of the voltage controlled oscillator;

FIG. 3 is a characteristic diagram showing a change in an oscillation frequency fin the relationship between a voltage of a control signal to be supplied to a gate of the variable capacitance element shown in FIG. 2 and an amplitude of an output signal from a terminal of a crystal resonator;

FIG. 15 is a view showing a configuration of a general crystal oscillator;

DESCRIPTION OF EMBODIMENTS

Hereinafter, a description will be made to an embodiment of the present invention in detail, with reference to the accompanied drawings.

First Embodiment

Figure 1:
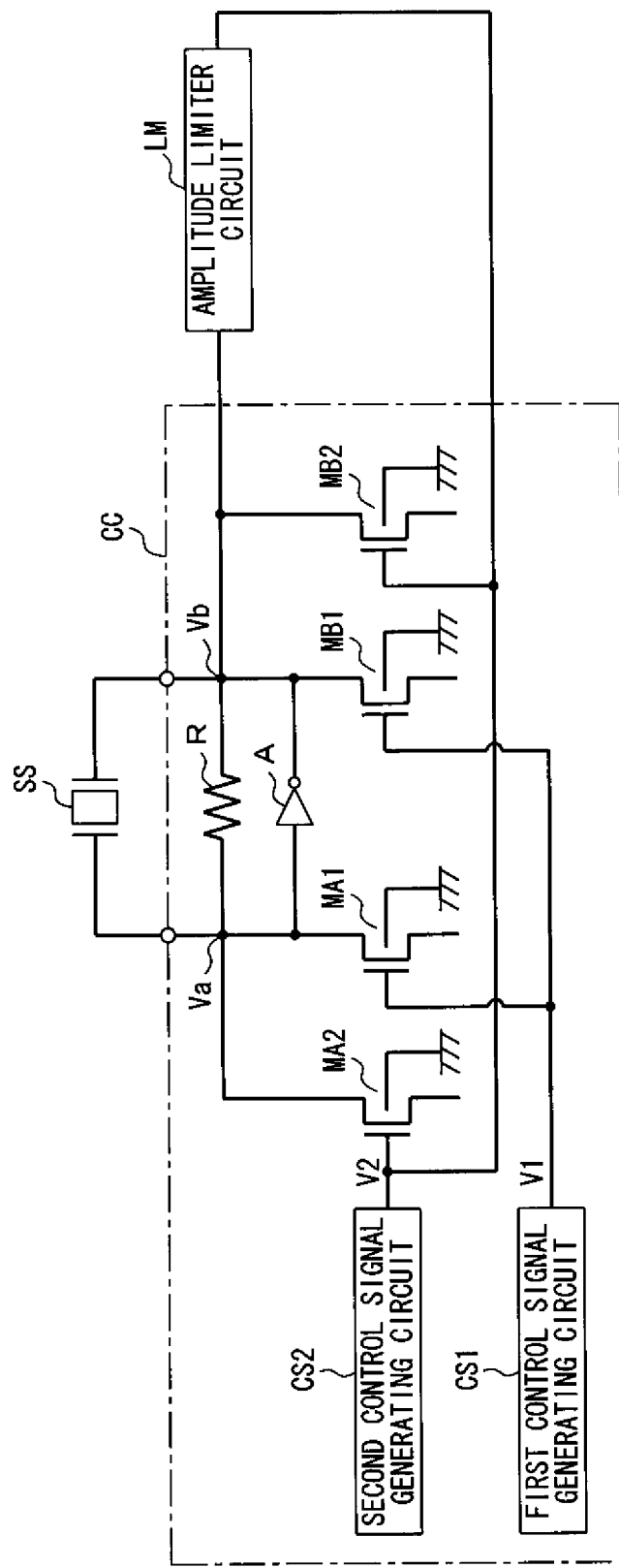
FIG. 1 is a circuit diagram showing a configuration of a voltage controlled oscillator as a first embodiment of the present invention.

FIG. 1 is a circuit diagram showing a configuration of a voltage controlled oscillator as a first embodiment of the present invention.

In FIG. 1, the voltage controlled oscillator includes an oscillator, which is composed of a crystal resonator SS and an oscillation circuit CC for oscillating the crystal resonator SS, and to which an amplitude limiter circuit LM is connected.

The oscillation circuit CC is composed of a feedback resistor R and variable capacitance elements MA1, MA2, MB1, MB2, an amplifier A, a first control signal generating circuit CS1 to generate a first control signal V1, and a second control signal generating circuit CS2 to generate a second control signal V2.

The second control signal V2 is supplied from the second control signal generating circuit CS2 to the amplitude limiter circuit LM as a signal to control a mode of its amplitude limiting operation.

The first control signal generating circuit and the variable capacitance elements MA1 and MB1 are a control circuit for temperature compensation to keep an oscillation frequency constant, regardless of temperature. The second control signal generating circuit and the variable capacitance elements MA1 and MB2 are a control circuit for an AFC selectable or arbitrary frequency as an oscillation frequency.

In the voltage controlled oscillator according to the first embodiment shown in FIG. 1, the oscillation circuit CC configures an adjusting section to control an oscillation frequency of the oscillator based on the control signal, and the amplitude limiter circuit LM configures an oscillation amplitude adjusting section to vary oscillation amplitude of the resonator.

FIG. 2 is a view showing a configuration example of the variable capacitance elements MA1, MA2, MB1, and MB2 that are components of the voltage controlled oscillator shown in FIG. 1.

In FIG. 2, the variable capacitance elements MA1, MA2, MB1, and MB2 each are a MOS transistor.

In the MOS transistor each being a variable capacitance element, a control signal V (in this case, a first control signal V1 or a second control signal V2) is applied to a gate G from a control signal generating circuit CS (in this case, a first control signal generating signal CS1 or a second control signal generating circuit CS2).

In addition, a source S of the MOS transistor each being a variable capacitance element are connected to any of the terminals of the crystal resonator SS, and an output signal having an oscillation frequency f is output to the source S. Here, a terminal voltage of one terminal of the crystal resonator SS is represented as Va, and a terminal voltage of the other terminal is represented as Vb.

A reference voltage (e.g. ground potential) is applied to a bulk B of the MOS transistor that is a variable capacitive element. In this example, a drain D of the MOS transistor that is the variable capacitance element has no destination to be connected, but it may take a configuration in which the drain D is connected to the source S.

In the variable capacitance elements as shown in FIG. 2, when a change in the oscillation frequency f is assumed with only one side of the variable capacitance element by the control signal, such a change in the oscillation frequency f corresponds to the magnitude of voltage of the control signal and that of an amplitude of an output signal from a terminal of the crystal resonator.

FIG. 3A and FIG. 3B are characteristic diagrams showing a change in the oscillation frequency f in the relationship between the voltage of the control signal to be applied to the gate G of the variable capacitance element shown in FIG. 2, and the amplitude of output signal from the source S (i.e. a terminal of the crystal resonator) of the variable capacitance element S shown in FIG. 2.

FIG. 3A illustrates how the oscillation frequency f is varied to a change in the voltage of the control signal in the variable capacitance element shown in FIG. 2.

FIG. 3B illustrates how the voltage of an output signal from a terminal of the crystal resonator is changed over time in the variable capacitance element shown in FIG. 2.

An explanation will be made to a variation in the oscillation frequency f indicated by a dotted line referring to FIG. 3A and FIG. 3B.

When the voltage of the control signal is equal to or lower than a potential after it is increased by a threshold voltage Vth from a Low level of an output signal, which corresponds to a segment (1) in FIG. 3A, the MOS transistor is in an off state where no channel is always established. At this moment, an oscillator equivalent capacitance component CL is not changed, and so the oscillation frequency f is kept constant.

Then, when the voltage of the control signal is equal to or higher than the potential after it is increased by the aforementioned threshold voltage Vth from the Low level of the output signal and equal to or lower than the potential after it is increased by the aforementioned threshold voltage Vth from a High level of the output signal, which corresponds to a segment (2) shown in FIG. 3A, the MOS transistor periodically repeats between an OFF state where no channel is established and an ON state where a channel is established. At this time, the higher the voltage of the control signal, the larger a ratio falling into the ON state where a channel is established.

On that account, the higher the voltage of the control signal, the larger the oscillator equivalent capacitance component CL, thereby resulting in a lowered oscillation frequency f.

Moreover, when the voltage of the control signal is equal to or higher than the potential after it is increased by the aforementioned threshold voltage Vth from the High level of the output signal, which corresponds to a segment (3) shown in FIG. 3A, the MOS transistor is always in the ON state where a channel is established. At this moment, the oscillator equivalent capacitance component CL is not changed, and so the oscillation frequency is kept constant.

Let us consider here a situation where a High level of the output signal from a terminal of the crystal resonator is clipped by ΔVb by the amplitude limiter circuit LM as indicated by a dotted line to a solid line as shown in FIG. 3B.

In this case, since a position of the potential that has been increased by the aforementioned threshold voltage Vth from the High level of the output signal is shifted to the left (i.e. to the lower potential side) by ΔVb, a region in the segment (2) shown in FIG. 3A narrows by that amount, and a region in the segment (3) conversely expands by that amount.

Consequently, the oscillation frequency f is changed by the control signal from the dotted line to the solid line, as shown in FIG. 3A, depending on a change in the amplitude of the output signal from a terminal of the crystal resonator.

Namely, by controlling the amplitude of the terminal voltage of the crystal resonator by the amplitude limiter circuit LN, the variation Δf of the oscillation frequency f is controlled with the control signal.

In the aforesaid embodiment, as is explained referring to FIG. 1, a configuration is taken where the second control signal is input to the amplitude limiter circuit LM.

In this configuration, when the oscillator equivalent capacitance component CL is decreased by lowering of the voltage of the second control signal, a limiting value of the amplitude limiter circuit LM is increased so as to make the amplitude of the terminal voltage Vb of the crystal resonator larger in the amplitude limiter circuit LM by use of the second control signal.

On the other hand, when the oscillator equivalent capacitance component CL is increased by raising the voltage V2 of the second control signal, the limiting value of the amplitude limiter circuit LM is decreased so as to reduce the amplitude of the terminal voltage Vb of the crystal resonator by the amplitude limiter circuit LM by use of the second control signal.

As discussed above, by controlling the variation ACL of the oscillator equivalent capacitance component CL with the voltage V2 of the second control signal and the limiting value of the amplitude limiter circuit LM, a difference in the variation ΔfL of the oscillation frequency can be minimized by the second control signal.

Let us consider here a situation where the voltage of the second control signal is shifted from V2 to V2' to thereby increase an oscillation frequency so that the oscillator equivalent capacitance component CL becomes small.

Figure 4:
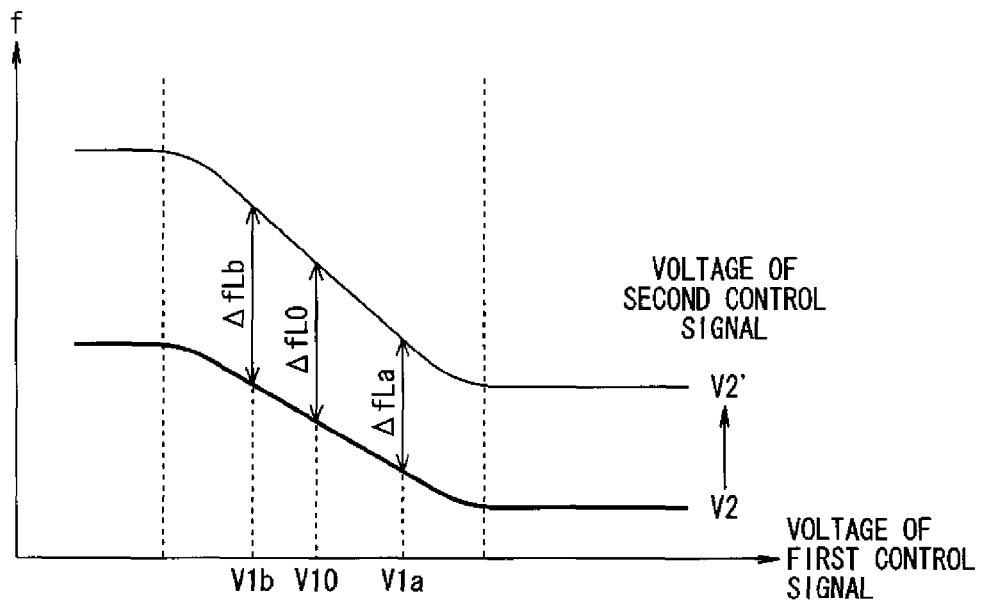
FIG. 4 is a view illustrating a state how an oscillation frequency of the oscillator is varied to a change in a first control signal, under some expected conditions.

When the amplitude limiter circuit LM is not provided, the circuitry exhibits characteristics as shown in FIG. 4.

In FIG. 4, a situation is illustrated how the oscillation frequency is varied to a change in the voltage of the first control signal when the amplitude limiter circuit LM is not provided, and the amplitude of the terminal voltage Vb of the crystal resonator is constant.

Figure 5:
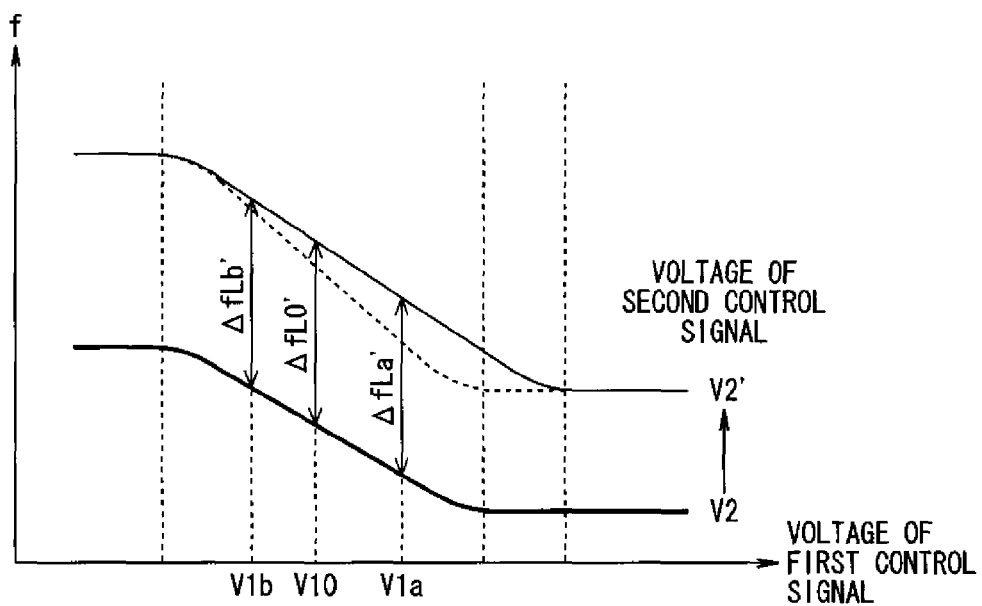
FIG. 5 is a view illustrating a state how an oscillation frequency of the oscillator is varied to a change in a first control signal, when amplitude of terminal voltage of the crystal resonator is magnified, under some expected conditions.

In FIG. 5, a situation is illustrated how the oscillation frequency is varied to a change in the first control signal when the amplitude of the terminal voltage Vb of the crystal resonator is made larger in the first embodiment of the present invention.

As shown in FIG. 5, when the limiting value of the amplitude limiter circuit LM is controlled so as to make the amplitude of the terminal voltage Vb of the crystal resonator larger by use of the amplitude limiter circuit LM, a variation in the oscillation frequency to a voltage change of the first control signal does not exhibit such characteristics as in the prior art indicated by the dotted line, but exhibits characteristics indicated by the solid line.

In this case, the variation $\Delta f$ of the oscillation frequency caused by changing the voltage of the second control signal will be changed as follows. When the voltage of the first control signal is V1a, the variation is shifted from $\Delta fLa$ to $\Delta fLa'$, when the voltage of the first control signal is V10, the variation is shifted from $\Delta fL0$ to $\Delta fL0'$, and further when the voltage of the first control signal is V1b, the variation is shifted from $\Delta fLb$ to $\Delta fLb'$.

Here, the variations $\Delta fLa$, $\Delta fLa'$, and $\Delta fLb$, $\Delta fLb'$ of the oscillation frequency, when the voltages of the first control signal are V1a and V1b, respectively, hold the following relationships, taking the variations $\Delta fL0$ and $\Delta fL0'$ of the oscillation frequency as references, when the voltage of the first control signal is V10.

$$\Delta fL0 - \Delta fLa > \Delta fL0' - \Delta fLa' \quad (3)$$

$$\Delta fLb - \Delta fL0 > \Delta fLb' - \Delta fL0' \quad (4)$$

As can be seen from these equations (3) and (4), when the oscillator equivalent capacitance component is so changed as to make it smaller by use of the second control signal, the limiting value of the amplitude limiter circuit LM is increased such that the amplitude of the terminal voltage Vb of the crystal resonator becomes larger by the amplitude limiter circuit LM. This reduces a difference in the variation $\Delta f$ of the oscillation frequency due to a change in the second control signal at a different voltage from that of the first control signal.

Figure 17:
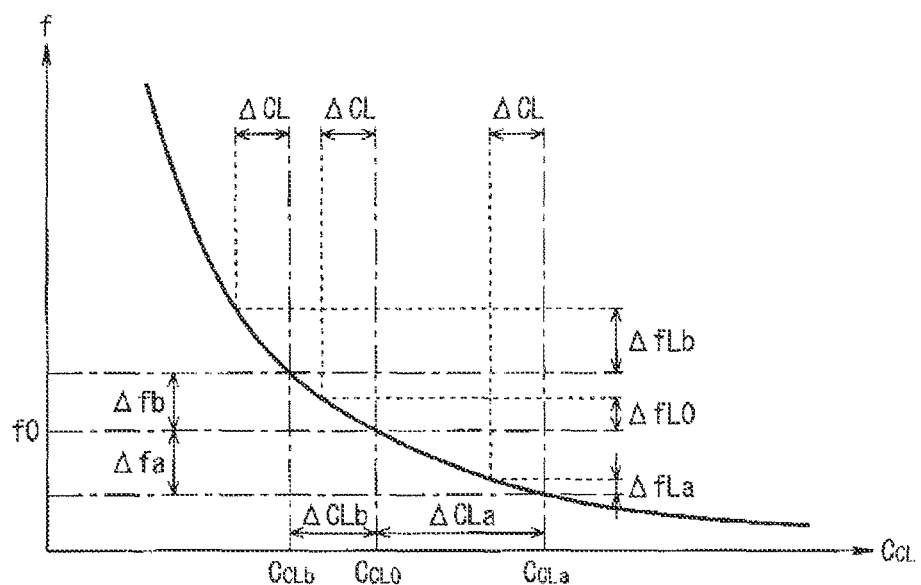
FIG. 17 is a view showing a change in an oscillation frequency to an oscillator equivalent capacitance.
Figure 18:
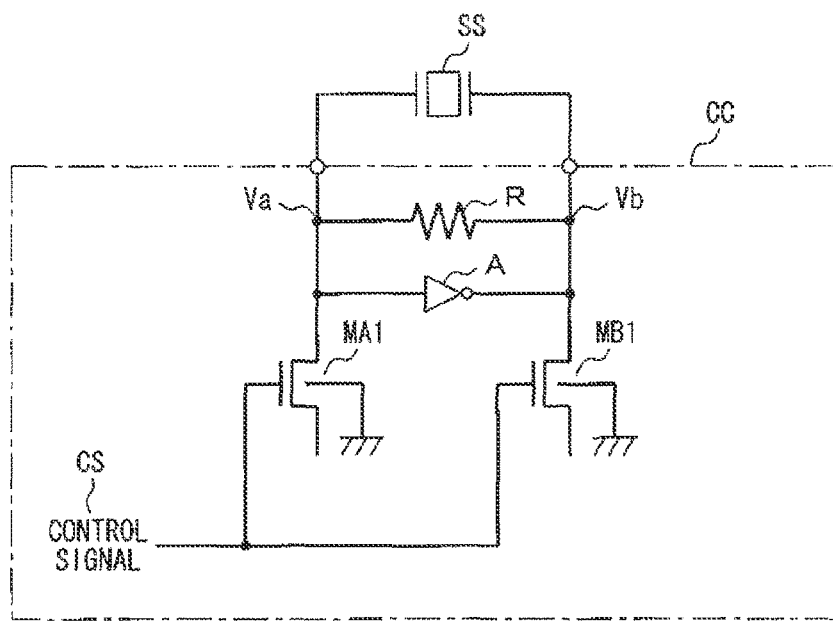
FIG. 18 is a circuit diagram showing prior art of a voltage controlled oscillator.
Figure 19:
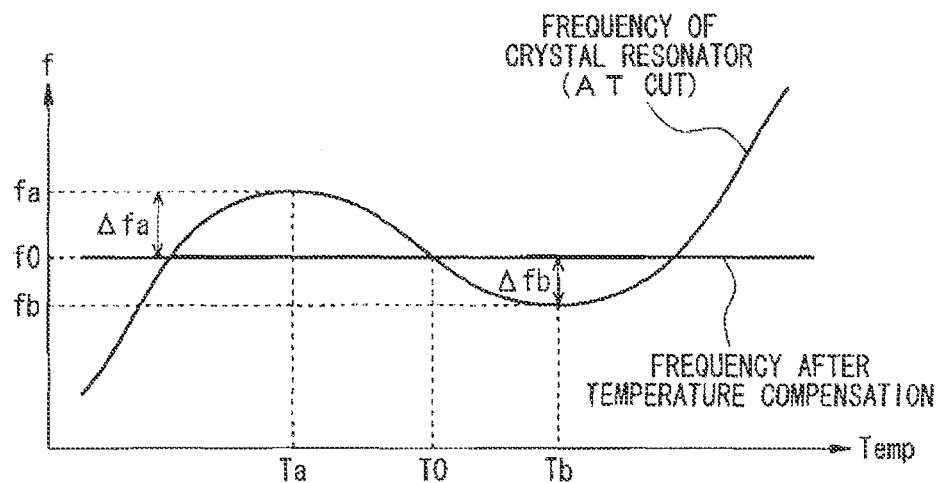
FIG. 19 is a view showing an example of temperature characteristics of an oscillation frequency in AT-cut crystal resonator, and an example of temperature characteristics of an oscillation frequency where the temperature characteristics are the temperature compensated by the temperature compensated oscillator.
Figure 20:
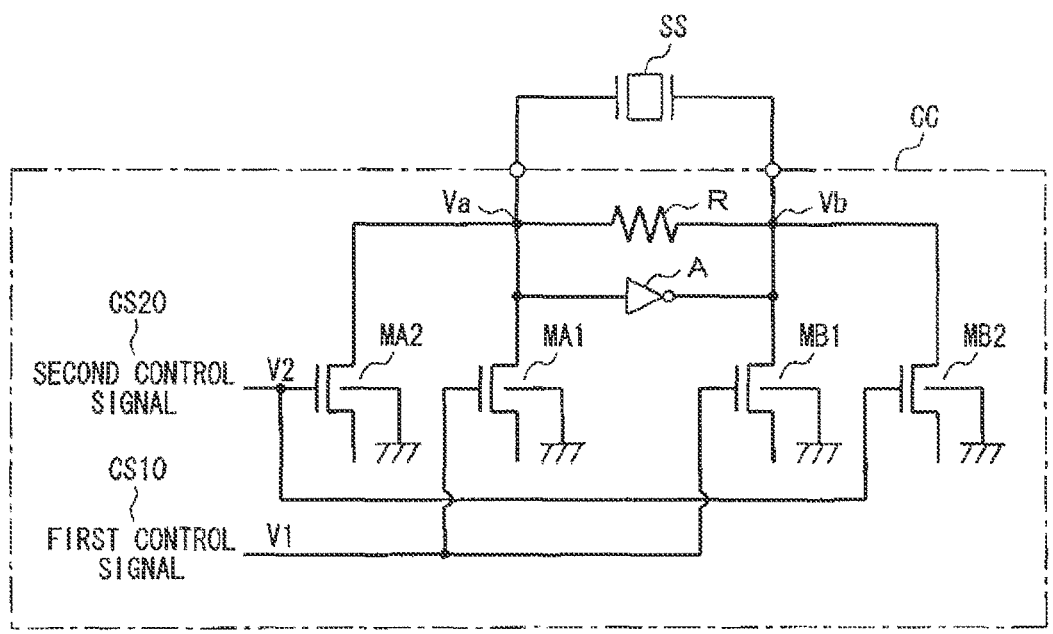
FIG. 20 is a circuit diagram showing a configuration example of the temperature compensated oscillator where a control signal is input as a first control signal to compensate the temperature characteristics of the oscillation frequency of the crystal resonator, and an AFC control signal is input as a second control signal.
Figure 21:
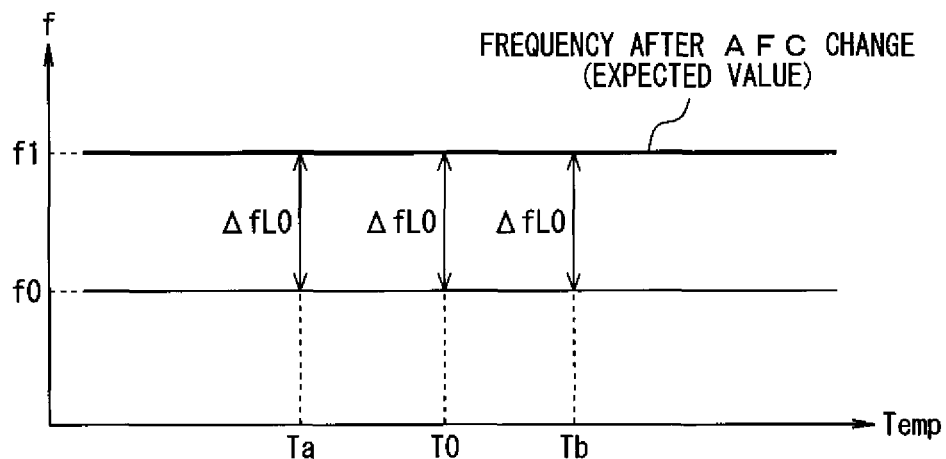
FIG. 21 is a view showing an example of temperature characteristics of an expected oscillation frequency when an offset and aging are adjusted by the temperature compensated oscillator shown in FIG. 20 after the temperature compensation.
Figure 22:
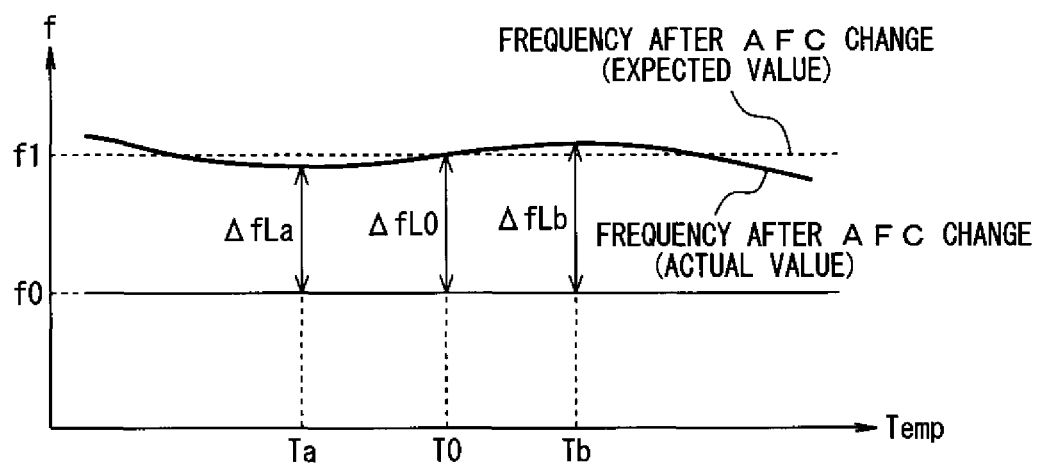
FIG. 22 is a view showing an example of temperature characteristics of an actual oscillation frequency when offset and aging are adjusted by the temperature compensated oscillator shown in FIG. 20 after the temperature compensation.

That is, in FIG. 17, as the difference among $\Delta fL0$, $\Delta fLa$, and $\Delta fLb$ gets smaller, the deterioration of the temperature compensation can be suppressed.

In the meantime, let us consider here a case where the voltage of the second control signal is shifted from V2 to V2" to make the oscillation frequency lower, so as to increase the oscillator equivalent capacitance component CL.

Figure 6:
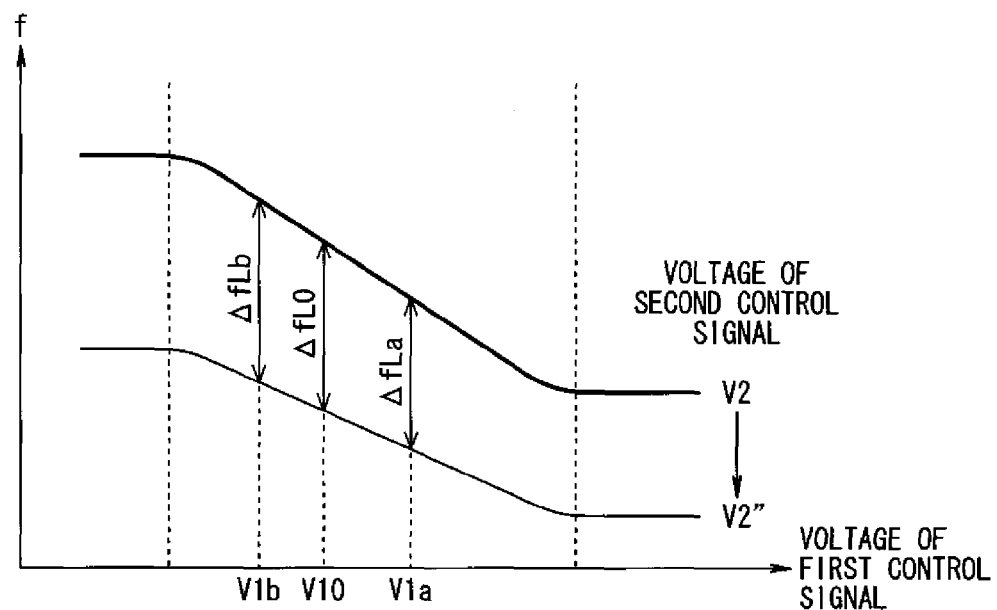
FIG. 6 is a view illustrating a state how an oscillation frequency of the oscillator is varied to a change in a second control signal, under some expected conditions.

When the amplitude limiter circuit LM is not provided, the characteristics as shown in FIG. 6 are exhibited.

Figure 7:
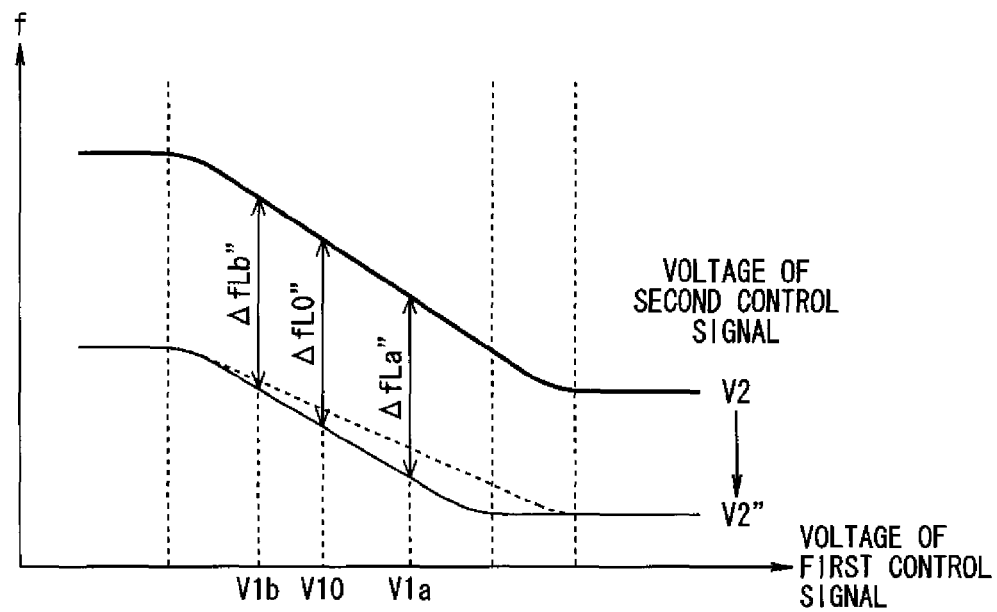
FIG. 7 is a view illustrating a state how an oscillation frequency of the oscillator is varied to a change in a second control signal, when the amplitude of the terminal voltage of the crystal resonator is reduced, under some expected conditions.

As shown in FIG. 7, in the first embodiment of the present invention, the limiting value of the amplitude limiter circuit LM is controlled so that the amplitude of the terminal voltage Vb of the crystal resonator is lowered by the amplitude limiter circuit LM, a variation in the oscillation frequency to the voltage changes of the first control signal does not exhibit a characteristics as in the prior art indicated by the dotted line, but exhibits the characteristics indicated by a solid line.

In this case, the variation $\Delta f$ of the oscillation frequency caused by changing the voltage of the second control signal will be given as follows. When the voltage of the first control signal is V1a, the variation is shifted from $\Delta fLa$ to $\Delta fLa'$, when the voltage of the first control signal is V10, the variation is shifted from $\Delta fL0$ to $\Delta fL0''$, and further when the voltage of the first control signal is V1b, the variation is shifted from $\Delta fLb$ to $\Delta fLb'$.

Here, the variations $\Delta fLa$, $\Delta fLa''$, and $\Delta fLb$, $\Delta fLb''$ of the oscillation frequency when the voltage of the first control signal is V1a and V1b, respectively, hold the following relationships, taking the variations $\Delta fL0$ and $\Delta fL0'$ of the oscillation frequency as references, when the voltage of the first control signal is V10.

$$\Delta fL0 - \Delta fLa > \Delta fL0'' - \Delta fLa'' \quad (5)$$

$$\Delta fLb - \Delta fL0 > \Delta fLb'' - \Delta fL0'' \quad (6)$$

As can be seen from these equations (5) and (6), when the oscillator equivalent capacitance component is so changed as to make it greater with the second control signal, the limiting value of the amplitude limiter circuit LM is increased such that amplitude of the terminal voltage Vb of the crystal resonator becomes smaller by the amplitude limiter circuit LM. This reduces a difference in the variation $\Delta fL$ of the oscillation frequency due to a change in the second control signal at a different voltage from that of the first control signal.

That is, in FIG. 17, as the difference among $\Delta fL0$, $\Delta fLa$, and $\Delta fLb$ gets smaller, the deterioration of the temperature compensation can be suppressed.

However, even when the Low level of the amplitude of the terminal voltage Vb of the crystal resonator is controlled, the variation $\Delta f$ of the oscillation frequency can be controlled by use of the second control signal. Accordingly, a similar effect and operation as described above may be exerted by doing so.

In addition, the amplitude limiter circuit LM is connected to the variable capacitance elements MA1 and MA2 side to control the High level or the Low level of the amplitude of the terminal voltage Va of the crystal resonator, thereby also enabling the variation $\Delta f$ of the oscillation frequency to be controlled by use of the second control signal. Accordingly, the similar effect and operation as described above may be exerted by doing so.

Any type of the amplitude limiter circuit LM may be applied, no matter what configuration it has, as long as it may enable the behavior of being controlled so as to make the terminal voltage Vb of the crystal resonator smaller, in a case where the second control signal is changed so that the oscillator equivalent capacitance component CL increases, and of being controlled so as to make the amplitude of the terminal voltage Vb of the crystal resonator larger, in a case where the second control signal is changed so that the oscillator equivalent capacitance component CL decreases.

Any sort of the control signal of the amplitude limiter circuit LM may be adopted, as long as it may enable the behavior of being controlled so as to make the amplitude of the terminal voltage Vb of the crystal resonator smaller, in a case where the second control signal is changed so that the oscillator equivalent capacitance component CL increases, and of being controlled so as to make amplitude of the terminal voltage Vb of the crystal resonator larger, in a case where the second control signal is changed so that the oscillator equivalent capacitance component CL decreases.

Any sort of the amplitude limiter circuit LM may be applied, no matter what configuration it has, as long as it may enable the behavior of being controlled so as to make the amplitude of the terminal voltage Vb of the crystal resonator smaller, in a case where the second control signal is changed so that the oscillator equivalent capacitance component CL increases, and of being controlled so as to make the amplitude of the terminal voltage Vb of the crystal resonator larger, in a case where the second control signal is changed so that the oscillator equivalent capacitance component CL decreases.

Second Embodiment

Figure 8:
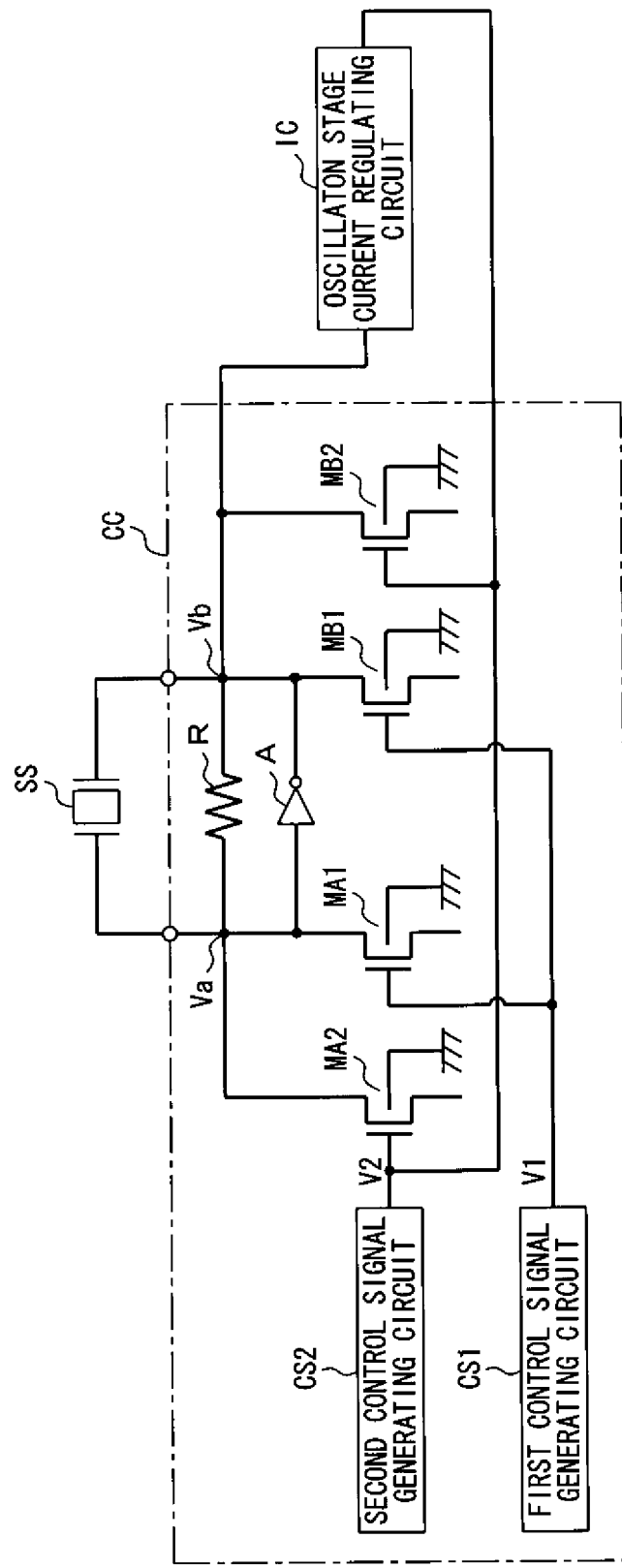
FIG. 8 is a circuit diagram showing a configuration of a voltage controlled oscillator according to a second embodiment of the present invention.

FIG. 8 is a circuit diagram showing a configuration of a voltage controlled oscillator according to a second embodiment of the preset invention. In FIG. 8, the same reference numerals denote the corresponding same sections shown in FIG. 1.

Whereas the first embodiment discloses the configuration in which the amplitude limiter circuit LM is connected, the second embodiment discloses in place thereof a configuration in which an oscillation stage current regulating circuit IC is connected.

Figure 9:
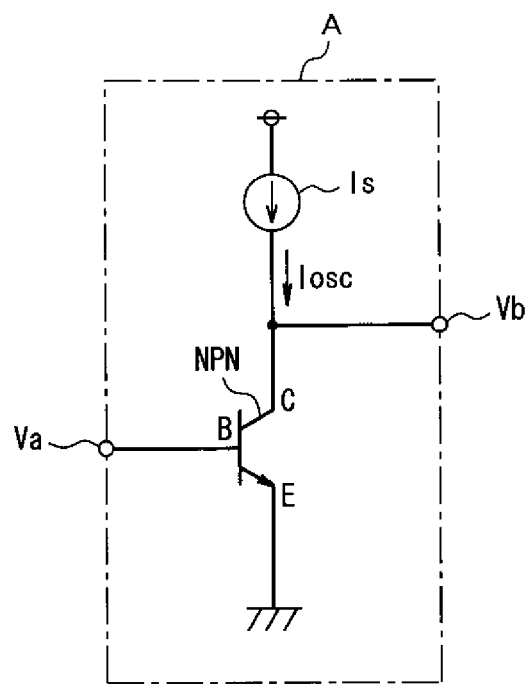
FIG. 9 is a circuit diagram showing a configuration example of an amplifier in the circuitry shown in FIG. 8.

Further, an amplifier A is composed e.g. of a current source Is and an NPN bi-polar transistor as shown in FIG. 9.

Figure 10:
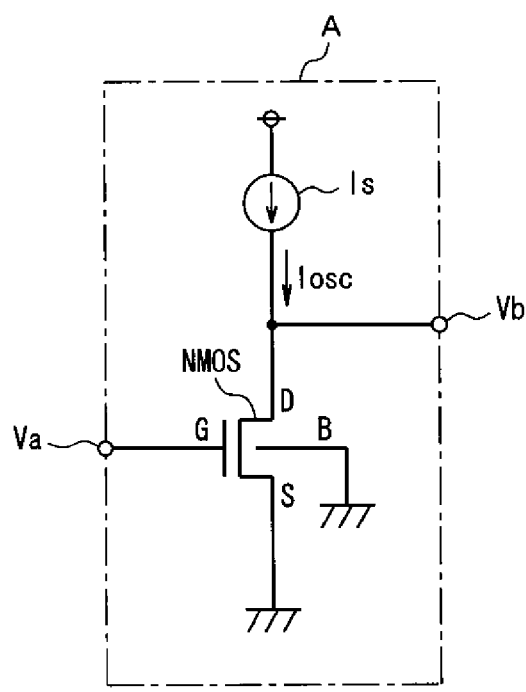
FIG. 10 is a circuit diagram showing another configuration example of the amplifier in the circuitry shown in FIG. 8.

Alternatively, the amplifier A is composed e.g. of a current source Is and an N-type MOSFET as shown in FIG. 10.

When an oscillation stage current Iosc flowing to the NPN bi-polar transistor or to the N-type MOSFET is high, the amplitude of the terminal voltage Vb of the crystal resonator becomes larger, and in contrast, when the oscillation current stage Iosc is low, the amplitude of the terminal voltage Vb of the crystal resonator becomes smaller.

In the voltage controlled oscillator shown in FIG. 8, the oscillation stage current Iosc can be controlled by the oscillation stage current regulating circuit IC.

Namely, when a current is increased by the oscillation stage current regulating circuit IC to increase the oscillation stage current Iosc, the amplitude of the terminal voltage Vb of the crystal resonator becomes larger. Conversely, when a current is decreased by the oscillation stage current regulating circuit IC to decrease the oscillation stage current Iosc. From this fact, it is possible to make the amplitude of the terminal voltage Vb of the crystal resonator smaller.

Accordingly, according to the second embodiment, in a case where a change is so made as to decrease the oscillator equivalent capacitance component CL by use of the second control signal, the oscillation stage current Iosc is controlled so that the amplitude of the terminal voltage Vb of the crystal resonator gets larger by the oscillation stage current regulating circuit IC. In a case where a change is so made as to increase the oscillator equivalent capacitance component CL by use of the second control signal, the oscillation stage current Iosc is controlled so that the amplitude of the terminal voltage Vb of the crystal resonator gets smaller by the oscillation stage current regulating circuit IC. In each case, the variation Δf of the oscillation frequency can be decreased by the second control signal, independent of what voltage the first control signal is. Therefore, the deterioration of the temperature compensation accuracy can be suppressed. In short, the second embodiment may exert the same effect as that of the first embodiment.

Alternatively, even when the oscillation stage current regulating circuit IC is connected to the variable capacitance elements MA1 and MA2 side, and a High level or a Low level of the amplitude of the terminal voltage Va of the crystal resonator is controlled, the variation Δf of the oscillation frequency can be controlled likewise by the second control signal. Consequently, the same effect and operation may be exerted by doing so.

Any sort of the oscillation stage current regulating circuit IC may be applied, no matter what configuration it has, as long as it may enable the oscillation stage current Iosc to be controlled so as to make the amplitude of the terminal voltage Vb of the crystal resonator smaller by decreasing the oscillation stage current Iosc, in a case where the second control signal is changed so that the oscillator equivalent capacitance component CL increases, and the oscillation stage current Iosc to be controlled so as to make the amplitude of the terminal voltage Vb of the crystal resonator larger by increasing the oscillation stage current Iosc, in a case where the second control signal is changed so that the oscillator equivalent capacitance component CL decreases.

Further, any sort of control signal of the oscillation stage current regulating circuit IC may be adopted, as long as it may enable the oscillation stage current Iosc to be controlled so as to make the amplitude of the terminal voltage Vb of the crystal resonator smaller by decreasing the oscillation stage current Iosc, in a case where the second control signal is changed so that the oscillator equivalent capacitance component CL increases, and the oscillation stage current Iosc to be controlled so as to make the amplitude of the terminal voltage Vb of the crystal resonator larger by increasing the oscillation stage current Iosc, in a case where the second control signal is changed so that the oscillator equivalent capacitance component CL decreases.

Furthermore, any sort of the oscillation stage current regulating circuit IC may be applied, no matter what configuration it has, as long as it may enable the oscillation stage current Iosc to be controlled so as to make the amplitude of the terminal voltage Vb of the crystal resonator smaller by decreasing the oscillation stage current Iosc, in a case where the second control signal is changed so that the oscillation stage equivalent capacitance component CL increase, and the oscillation stage current Iosc is controlled so as to make the amplitude of the terminal voltage Vb of the crystal resonator larger by increasing the oscillation stage voltage Iosc, in a case where the second control signal is changed so that the oscillator equivalent capacitance component CL decreases.

In the voltage controlled oscillator according to the embodiment shown in FIG. 8, the oscillation circuit CC configures an adjusting section to control an oscillation frequency from the oscillator based on the control signal, and the oscillation stage current regulating circuit IC configures an oscillation amplitude adjusting section to vary an oscillation amplitude of the resonator.

Third Embodiment

Figure 11:
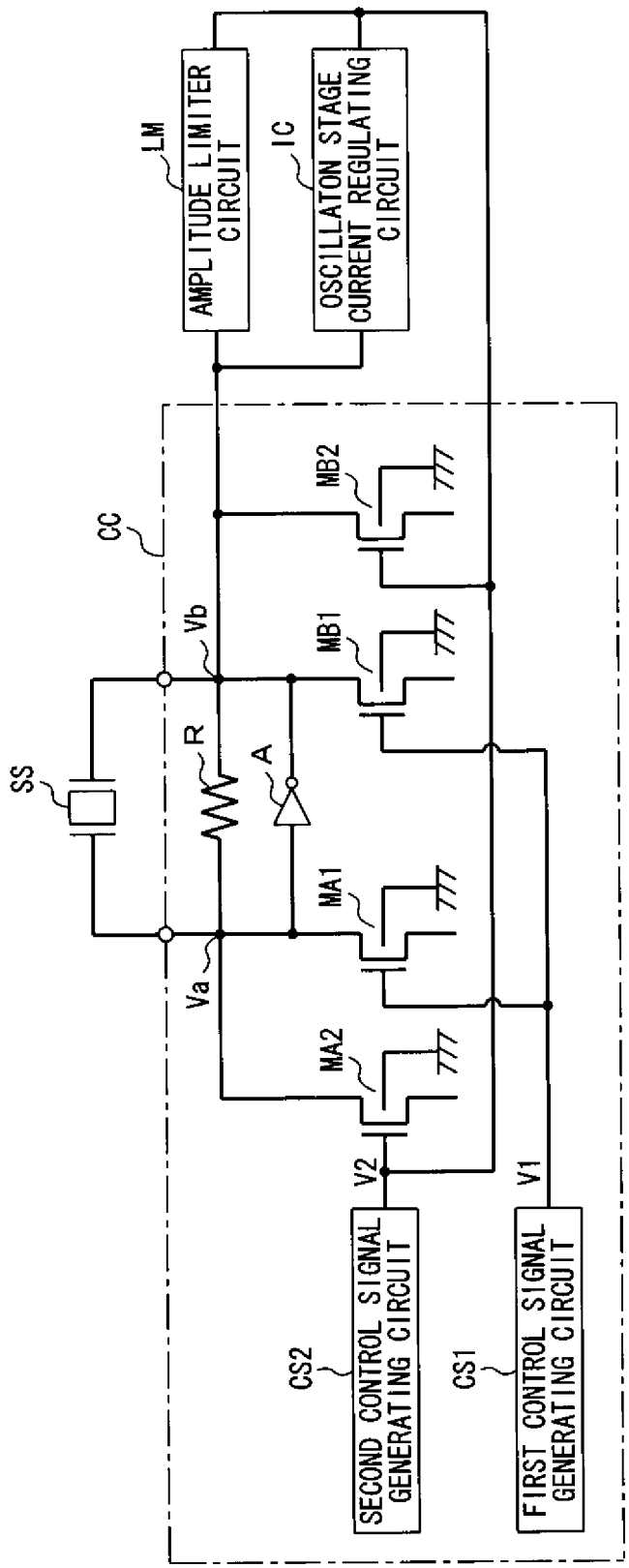
FIG. 11 is a circuit diagram showing a configuration of a voltage controlled oscillator according to a third embodiment of the present invention.

FIG. 11 is a circuit diagram showing a configuration of a voltage controlled oscillator according to a third embodiment of the present invention. In FIG. 11, the same reference numerals denote the same corresponding sections shown in FIG. 1.

In the third embodiment, a configuration is taken in which the amplitude limiter circuit LM and the oscillation stage current regulating circuit IC are connected.

In the third embodiment, to implement this configuration, the amplitude of the terminal voltage Vb of the crystal resonator is controlled by the amplitude limiter circuit LM and by the oscillation stage current regulating circuit IC according to the second control signal, thereby exerting the same effect as that of the first embodiment.

In the voltage controlled oscillator according to the embodiment shown in FIG. 11, the oscillation circuit CC configures an adjusting section to control an oscillation frequency from the oscillator based on the control signal, and the amplitude limiter circuit LM and the oscillation stage current regulating circuit IC configures an oscillation amplitude adjusting section to allow varied oscillation amplitude from the resonator.

Amplitude Limiter Circuit

The explanation has qualitatively been given that the amplitude limiter circuit LM is a circuit which exhibits characteristics in which a controlled amount (amplitude of the terminal voltage of the crystal resonator) appearing in its output decreases resultantly according to an increase in the control signal (second control signal V2) to be supplied to its input. While the circuit exhibiting such characteristics may take exceedingly various modes depending on its rating and circuit system, when the product specifications are once determined for carrying out the present invention, circuitry will be specifically designed so as to adapt them to this specification.

Figure 12A:
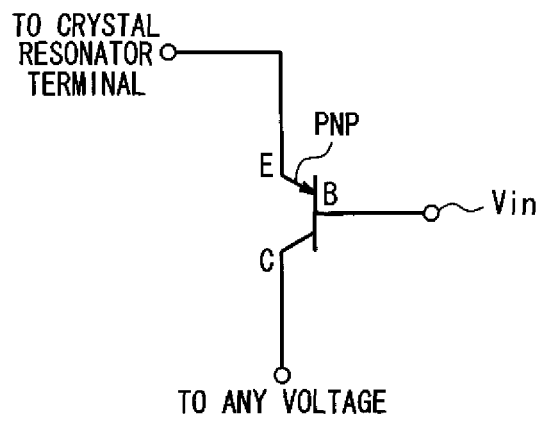
FIG. 12 is a circuit diagram showing an example where an emitter follower circuit is adopted as an amplitude litter circuit.
Figure 12B:
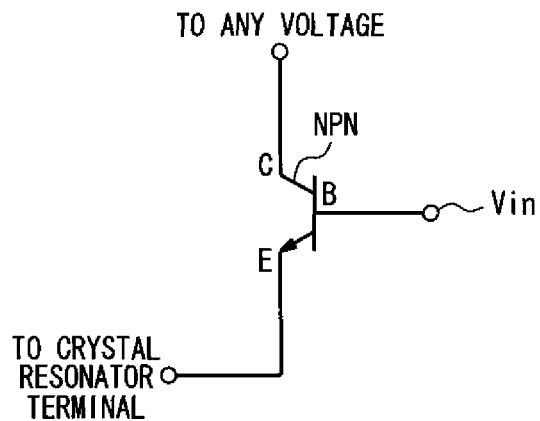
Figure 13A:
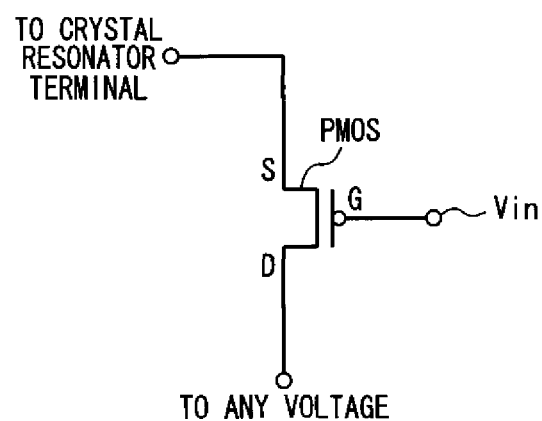
FIG. 13 is a circuit diagram showing an example where a source follower circuit is adopted as an amplitude litter circuit.
Figure 13B:
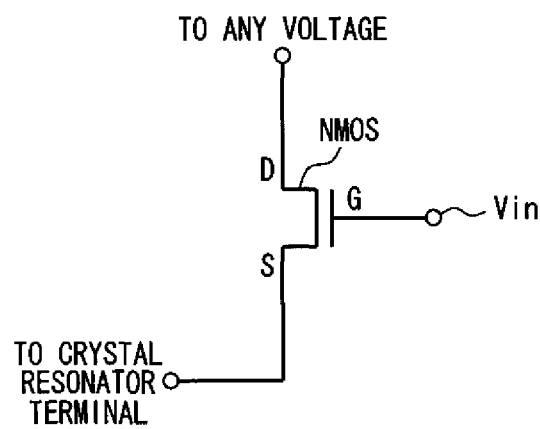

An example of the circuit configuration to obtain such characteristics includes an emitter follower circuit composed of a bi-polar transistor as shown e.g. in FIG. 12A to FIG. 12B, or a source follower circuit composed of a MOSFET as shown in FIG. 13A to FIG. 13B.

In the example where the amplitude limiter circuit LM is configured of the emitter follower circuit shown in FIG. 12A to 12B, an input voltage Vin (its voltage corresponds to the control signal associated with the amplitude limiter circuit), which is varied by the control voltage V2 applied from the second control signal generating circuit CS2, is supplied to the base of the transistor, its emitter is connected to a terminal (its voltage corresponds to the controlled amount associated with the amplitude limiter circuit) of the crystal resonator, and its collector is connected to any voltage.

In the example where the amplitude limiter circuit LM is configured of the source follower circuit shown in FIG. 13A to 13B, an input voltage Vin (its voltage corresponds to the control signal associated with the amplitude limiter circuit), which is varied by the control voltage V2 applied from the second control signal generating circuit CS2 is input to the gate of the MOSFET, its source is connected to a terminal (its voltage corresponds to the controlled amount associated with the amplitude limiter circuit) of the crystal resonator, and its drain is connected to any voltage.

In the example where the amplitude limiter circuit LM is configured of the emitter follower circuit shown in FIG. 12A and the source follower circuit shown in FIG. 13A, if this circuitry is connected to the variable capacitance elements MB 1 and MB2 side, a High level of the amplitude of the terminal voltage Vb of the crystal resonator can be controlled. Similarly, in the example where the amplitude limiter circuit LM is configured of the emitter follower circuit shown in FIG. 12B and the source follower circuit shown in FIG. 13B, if this circuitry is connected to the variable capacitance elements MB1 and MB2 side, a Low level of the amplitude of the terminal voltage Vb of the crystal resonator can be controlled.

Oscillation Stage Current Regulating Circuit

The explanation has qualitatively been given that the oscillation stage current regulating circuit IC applied to the aforementioned corresponding embodiment exhibits characteristics in which an controlled amount (the oscillation stage current Iosc that is the amplitude of the terminal voltage of the crystal resonator) appeared in its output increases resultantly, according to an increase in the control signal (second control signal V2) to be supplied to its input. While the circuit exhibiting such characteristics may take exceedingly various modes depending on its rating and circuit system, when the product specifications are once determined for carrying out the present invention, circuitry will be specifically designed so as to adapt them to this specification.

A circuit configuration to obtain the characteristics includes circuits as shown in FIGS. 14A to 14D.

Figure 14A:
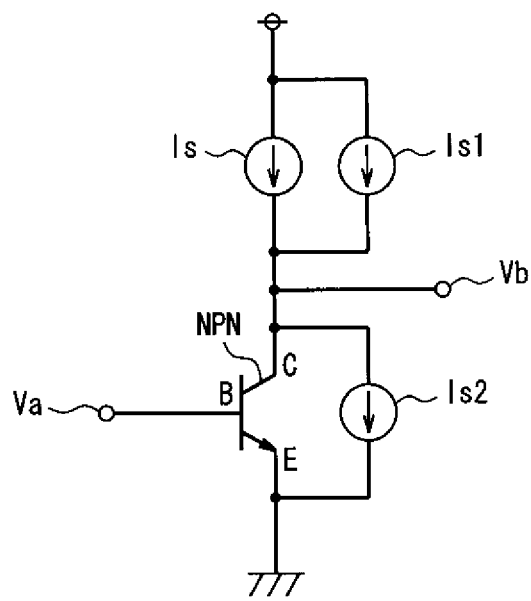
FIG. 14 is a circuit diagram showing a configuration example of an oscillation stage current regulating circuit.

In a configuration example shown in FIG. 14A, the oscillation stage current regulating circuit IC is added, in addition to an amplifier A having a current source Is and a bi-polar transistor.

The oscillation stage current regulating circuit IC includes a current source Is1 to add a current flowing to a collector of the NPN bi-polar transistor based on an input voltage (control signal), and a current source Is2 to subtract a current flowing to a collector of the NPN bi-polar transistor based on an input voltage (control signal). Here, the oscillation stage current regulating circuit IC may take a configuration using only either of the current sources. In the circuit configuration example discussed referring to FIG. 14A, a current flowing through a collector terminal Vb of the NPN bi-polar transistor corresponds to the aforesaid controlled amount according to the oscillation stage current regulating circuit IC.

Figure 14B:
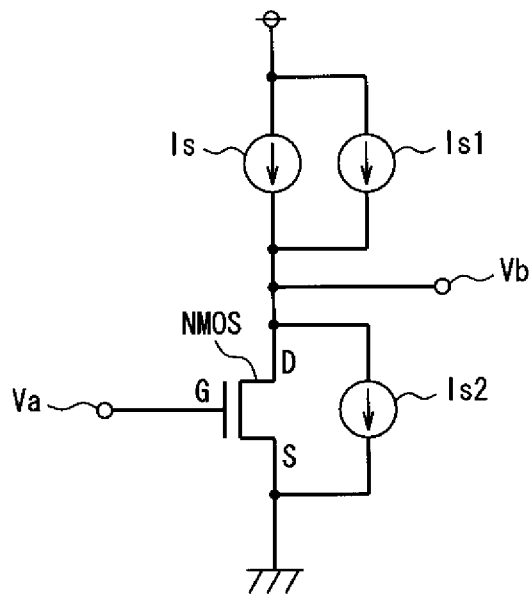

In the configuration example shown in FIG. 14B, the oscillation stage current regulating circuit IC is added, in addition to the amplifier A having the current source Is and the N-type MOSFET shown in FIG. 10.

The oscillation stage current regulating circuit IC includes the current source Is1 to add a current flowing to the drain of the N-type MOSFET based on an input voltage (control signal), and the current source Is2 to subtract a current flowing to a drain of the N-type MOSFFT based on an input voltage (control signal). Here, the oscillation stage current regulating circuit IC may take a configuration using only either of the current sources. In the circuit configuration example discussed referring to FIG. 14B, the current flowing through the drain terminal Vb of the N-type MOSFET corresponds to the aforesaid controlled amount according to the oscillation stage current regulating circuit IC.

Figure 14C:
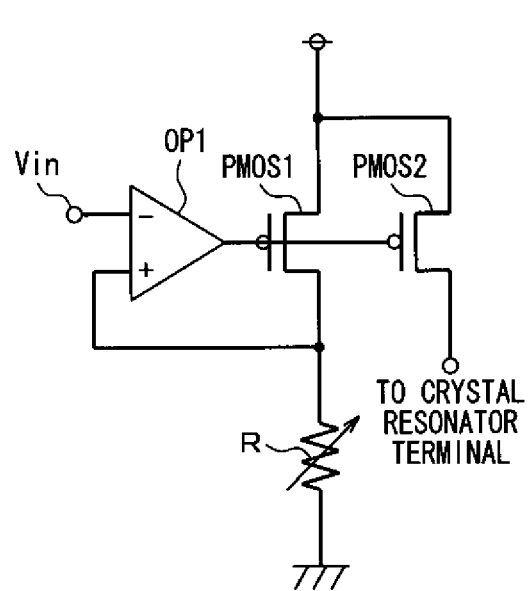

FIG. 14C is a circuit diagram showing an example of a configuration of the current source Is1.

The current source Is1 includes an amplifier OP1 with one input terminal to which an input voltage Vin is supplied, two P-type MOSFETs 1 and 2 each having a gate connected to an output terminal of the amplifier OP1, and a variable resistance element R with one end connected to a drain of the P-type MOSFET and connected to the other input terminal of the amplifier OP1, and the variable resistance element R having the other end connected to ground.

Using the control voltage V2 supplied from the second control signal generating circuit CS2, a voltage of the input voltage Vin or a resistance value of the variable resistance element R is varied. From the drain of the P-type MOSFET 2, a current is output and added to the collector of the NPN bi-polar transistor shown in FIG. 14A, or to the drain of the N-type MOSFET shown in FIG. 14B.

Figure 14D:
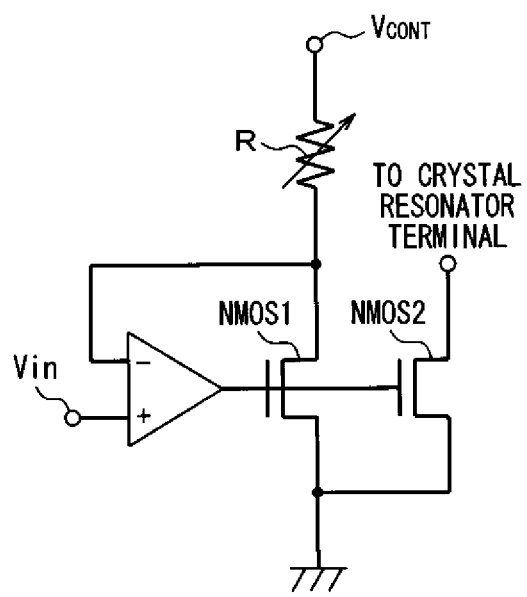
Figure 16:
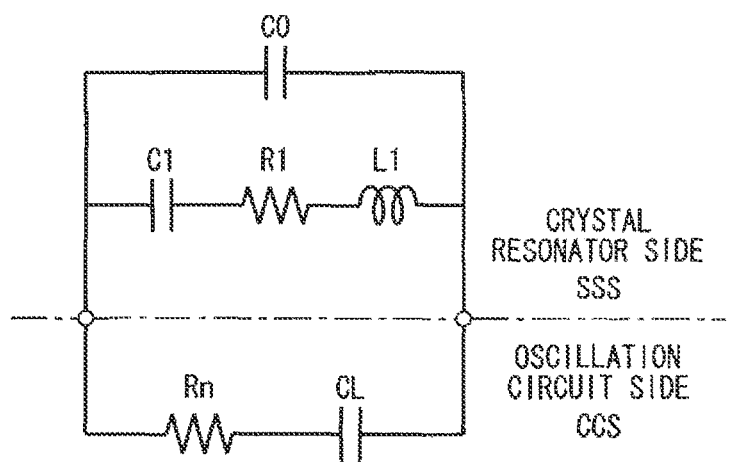
FIG. 16 is a view showing an equivalent circuit of the crystal oscillator shown in FIG. 15.

FIG. 14D is a circuit diagram showing one example of a configuration of the current source Is2.

The current source Is2 includes an amplifier OP2 with one input terminal to which an input voltage Vn is supplied, two N-type MOSFETs 1 and 2 each having a gate connected to an output terminal of the amplifier OP2, and a variable resistance element R with one end connected to the drain of the N-type MOSFET 1 and also to the other input terminal of the amplifier OP2, and the variable resistance element R having the other end connected to any voltage Vcont.

Using the control voltage V2 from the second control signal generating circuit CS2, a voltage of the input voltage Vin, a voltage of any voltage Vcont, or a resistance value of the variable resistance element R is varied. From the drain of the N-type MOSFET, a current is drawn to be subtracted from the collector of the NPN bi-polar transistor shown in FIG. 14A or from the drain of the N-type MOSFET shown in FIG. 14B.

INDUSTRIAL APPLICABILITY

The present invention is applicable to an oscillator including an oscillation circuit for oscillating a resonator.

REFERENCE SIGNS LIST

SS: crystal resonator
CC: oscillation circuit
R: feedback resistor
A: amplifier
CS1, CS2: control signal generating circuit
MA1, MA2, MB1, MB2: variable capacitance element
Va: crystal resonator terminal (input side voltage)
Vb: crystal resonator terminal (output side voltage)
LM: amplitude limiter circuit
IC: oscillation stage current regulating circuit
Ca, Cb: load capacitance element
C1: motional capacitance component
R1: resonance resistance component
L1: motional inductance component
C0: shunt capacitance
Rn: negative resistance component
CL: oscillator equivalent capacitance component
Is: current source
NPN: NPN bi-polar transistor
PNP: PNP bi-polar transistor
NMOS: N-type MOSFET
PMOS: P-type MOSFET
OP1, OP2: amplifier

The invention claimed is:

1. An oscillator including an oscillation circuit to oscillate a crystal resonator, comprising:
a first adjusting section for receiving a first control signal to adjust an oscillation frequency of the oscillator;
a second adjusting section for receiving a second control signal to adjust the oscillation frequency of the oscillator; and
an oscillation amplitude adjusting section for receiving the second control signal to vary an oscillation amplitude of the crystal resonator, together with the second adjusting section adjusting the oscillation frequency of the oscillator,
wherein the first adjusting section is an adjusting section for temperature compensation to keep the oscillation frequency constant regardless of a temperature, and the second adjusting frequency is an adjusting section for Auto Frequency Control (AFC) in which any frequency is selectable as the oscillation frequency.

2. The oscillator according to claim 1, wherein the oscillation amplitude adjusting section is an oscillation amplitude limiter unit to vary an oscillation amplitude.

3. The oscillator according to claim 1, wherein the oscillation amplitude adjusting section is an oscillation stage current regulating section to regulate a current at the oscillator stage.

* * * * *